United States Patent
Campo et al.

(10) Patent No.: US 6,572,782 B2
(45) Date of Patent: Jun. 3, 2003

(54) PROCESS FOR RECYCLING CDTE/CDS THIN FILM SOLAR CELL MODULES

(75) Inventors: Manuel Diequez Campo, Hanau (DE); Dieter Bonnet, Friedrichsdorf (DE); Rainer Gegenwart, Erfurt (DE); Jutta Beier, Hofheim (DE)

(73) Assignee: ANTEC Solar GmbH, Arnstadt (DE)

( * ) Notice: Subject to any disclaimer, the term of this patent is extended or adjusted under 35 U.S.C. 154(b) by 40 days.

(21) Appl. No.: 09/939,390

(22) Filed: Aug. 24, 2001

(65) Prior Publication Data

US 2002/0030035 A1 Mar. 14, 2002

(30) Foreign Application Priority Data

Sep. 11, 2000 (EP) .......................................... 00 119 751

(51) Int. Cl.$^7$ .............................. C22B 7/00; C01B 9/02
(52) U.S. Cl. ............................. 216/75; 216/72; 75/669; 423/107
(58) Field of Search ....................... 216/72, 75; 75/586, 75/669; 423/107

(56) References Cited

U.S. PATENT DOCUMENTS

| | | | |
|---|---|---|---|
| 5,453,111 A | 9/1995 | Myerson et al. | 75/725 |
| 5,897,685 A | 4/1999 | Goozner et al. | 75/743 |
| 6,030,433 A | * 2/2000 | Luggenhorst et al. | 75/658 |
| 6,129,779 A | * 10/2000 | Bohland et al. | 423/109 |

FOREIGN PATENT DOCUMENTS

| | | | |
|---|---|---|---|
| DE | 43 37 309 A | 3/1995 | ............ H01J/37/32 |
| EP | 0 893 250 A | 1/1999 | ........... B32B/35/00 |
| WO | 00 47343 A | 8/2000 | ............ B08B/3/00 |

OTHER PUBLICATIONS

R.A. Sasala et al., "Physical And Chemical Pathways For Economic Recycling Of Cadmium Telluride Thin–Film Photovoltaic Modules", IEEE, 1996.

* cited by examiner

*Primary Examiner*—Robert Kunemund
*Assistant Examiner*—Terrence M Mackey
(74) *Attorney, Agent, or Firm*—Quarles & Brady LLP

(57) ABSTRACT

Recycling process for CdTe/CdS thin film-solar cell modules in which the modules are mechanically disintegrated into module fragments, the module fragments are exposed to an oxygen-containing atmosphere at a temperature of at least 300° C. causing a pyrolysis of adhesive material contained in the module fragments in form of a hydrocarbon based plastics material and the gaseous decomposition products that are generated during the pyrolysis are discharged, and, afterwards, the module fragments freed from the adhesive means are exposed to a chlorine-containing gas atmosphere at a temperature of more than 400° C. causing an etching process wherein the $CdCl_2$ and $TeCl_4$ that are generated in the etching process are made to condense and precipitate by cooling.

16 Claims, No Drawings

PROCESS FOR RECYCLING CDTE/CDS THIN FILM SOLAR CELL MODULES

CROSS REFERENCES TO RELATED APPLICATIONS

This application claims the priority benefit of European patent application EP 00 119 751.6 filed on Sep. 11, 2000.

STATEMENT REGARDING FEDERALLY SPONSORED RESEARCH

Not Applicable

BACKGROUND OF THE INVENTION

The invention relates to a recycling process for CdTe/CdS thin film solar cell modules.

CdTe thin film solar cells in the form of CdTe/CdS thin film solar cells are disclosed for example in the EP 0 535 522 A2 corresponding to U.S. Pat. No. 5,304,499. The modules have a glass substrate (preferably window glass substrate (soda-lime glass)) that is coated with a TCO layer (preferably ITO layer), a thin CdS layer (e.g. 100 nm thick) and a CdTe layer (e.g. between 3 and 7 $\mu$m thick), on which there is provided a vapour-deposited back contact layer of metal (for example nickel) or a double layer in the form of a semiconductor layer (for example antimony telluride) and an additional metal layer. The module is structured and treated e.g. according to a principle shown in U.S. Pat. No. 4,243,432 in such a way that it, for example, comprises about 100 individual cells per meter of its length. On its backside opposite from the light exposure side, the module is covered by a back glass which is glued by means of a plastics adhesive. The adhesive consists of a chlorine-free plastics adhesive on hydrocarbon base, and, in most cases, the adhesive consists of ethylene/vinyl acetate copolymers (ENA or EVA). The back glass can be fastened to the coated and structured substrate module glass by an EVA film by means of standard processes. Electrical conductors fastened to the contacts of the outer cells, e.g. in the form of metal bands, are led out of the module through bores in the back glass.

A method for recycling solar cell modules is disclosed in U.S. Pat. No. 5,997,718 for use with thin film solar cells, such as disclosed in U.S. Pat. No. 5,453,111. The solar cells according to U.S. Pat. No. 5,997,718 are crushed to pea size e.g. in conventional shredder devices and then treated wet-chemically at temperatures between ambient temperature and a maximum temperature of 120° C., preferably around 80° C., first with diluted nitric acid, in order to oxidize the metals present and to bring them into the treatment solution. The treatment delaminates the EVA-layer which can then be skimmed from the leaching treatment solution. The $SnO_2$-layer coated on the substrate glass is not dissolved by the diluted nitric acid. The metalliferrous treatment solution afterwards undergoes electrolysis using platinum electrodes, in which the tellurium precipitates at the cathode for subsequent recovery and the cadmium remains in solution.

This method disclosed in U.S. Pat. No. 5,997,718 is an overview of the different, in part rather expensive, recycling processes for solar cell modules (wet-chemical, pyrometallurgical, hydrometallurgical etc.). Accordingly, a need exists for an alternative method of recycling thin film solar cell modules which is economical.

BRIEF SUMMARY OF THE INVENTION

The present invention provides a method for recycling CdTe/CdS thin film solar cell modules. The method includes a) mechanically disintegrating thin film solar cell modules into module fragments; b) exposing said module fragments to an oxygen-containing atmosphere at a temperature of at least 300° C. causing a pyrolysis of adhesive material contained in the module fragments in the form of a hydrocarbon based plastics adhesive material and the gaseous decomposition products that generate during the pyrolysis are discharged; and c) exposing said module fragments freed from the adhesive means to a chlorine-containing gas atmosphere at a temperature of more than 400° C. causing an etching process wherein the $CdCl_2$ and $TeCl_4$ that are generated in the etching process are made to condense and precipitate by cooling.

A general objective of the present invention is to provide an alternative new recycling process which can be carried out in an economic manner. This objective is accomplished by recycling the solar cell modules in a gaseous environment.

This and still other objects and advantages of the present invention will be apparent from the description which follows. In the detailed description below, preferred embodiments of the invention will be described in reference to the accompanying drawings. These embodiments do not represent the full scope of the invention. Rather the invention may be employed in other embodiments. Reference should therefore be made to the claims herein for interpreting the breadth of the invention.

DETAILED DESCRIPTION OF THE PREFERRED EMBODIMENTS

The recycling process according to the present invention for CdTe/CdS thin film-solar cell modules avoids a wet-chemical separation of the components of the modules and instead works successfully exclusively in gas atmospheres. The modules are first mechanically disintegrated or crushed, whereby the requirements regarding the degree of disintegration and homogeneity of the fragments are low. Thanks to the applied gas treatment, a coarse crushing into fragments from some cm to around 10 cm is sufficient.

The module fragments are exposed to an oxygen containing atmosphere at a temperature of at least 300° C. at which temperature the organic adhesive means contained in the fragments in the form of a chlorine-free adhesive on hydrocarbon base (normally Ethylen-Vinylacetate-Copolymer (EVA)) is disintegrated pyrolytically. Ideally, $H_2O$ and $CO_2$ are generated during this treatment. But even if residues of hydrocarbon compounds such as methane gas and the like occur, this is not critical, since all decomposition products of the pyrolysis are simply drawn off, such as by a vacuum, and can be completely burned. Preferably, for economic reasons, air is used as oxygen carrier gas. The process according to the present invention is, however, not limited to this and can also work with other carrier gases (e.g. argon) and at higher oxygen partial pressures than those of air. Preferably the pyroloysis takes place at temperatures between 400° C. and 520° C. Thereby, it is ensured on the one hand that the combustion runs so carefully that cadmium telluride does not evaporate yet. On the other hand the combustion is accelerated at temperatures over 400° C. and treatment time periods can be as short as about five minutes.

The pressure in the treatment chamber during the pyrolysis is not critical. In a preferred embodiment air is pumped by means of a simple membrane pump having a pumping capacity of about 1 liter/min, through the heated reaction zone of a tubular furnace.

The module fragments freed from the adhesive are exposed to a chlorine and preferably also nitrogenous gas atmosphere at a temperature of more than 400° C. thereby inducing an etching process. Gaseous $CdCl_2$ and $TeCl_4$ are formed in this etching process and are made to condense and precipitate by cooling. An etching process is principally also possible below 400° C., however, it is so inefficient that the energy consumption and the treatment times become too high to be acceptable. Therefore preferably higher temperatures of more than 450° C. are used in this process step where a treatment of a few minutes is sufficient for etching away the metal layer.

The preferred upper temperature limit of around 500° C. for the etching process (as well as the preceding pyrolysis) results from the fact that the inventional tests were performed on modules, which had soda-lime glass (window glass) as substrate material. With high temperature glasses such as borosilicate glasses or the like, accordingly higher temperatures are possible. Principally, the temperature of the process steps could be adjusted much higher, however, there is an upper limit because of the heat resistance and the melting point of the glass substrate material of the respective module to be recycled.

During the etching process, the gas atmosphere is preferably adjusted to sub-atmospheric or reduced pressure. This is done in order to minimize the gas throughput and to increase the etching rates. In the test series performed, a pressure range between 100 mbar and 600 mbar proved to be suitable. The pressure range can, however, be chosen freely in wide limits, particularly if one accepts a higher material consumption.

Preferably, nitrogen is added to the gas atmosphere in the etching process. This, in view of the high reactivity of chlorine gas, simplifies process control and makes the process clearly less polluting. The chlorine partial pressure preferably amounts to more than 1% in relation to the nitrogen partial pressure of the gas mixture, because in case of still lower values of chlorine the etching rates decrease considerably. Values over 10% are absolutely possible, however, not suitable because of the higher material consumption, since the etching rate is hardly increased by further increasing the chlorine partial pressure above values of 10% of the nitrogen partial pressure. Moreover, the chlorine partial pressure can be lowered at higher temperature.

Etching in chlorine and nitrogenous gas atmosphere can be performed in about 0.5 to 5 minutes. These values were ascertained for a temperature range from 450° C. to 500° C. under different pressure conditions. Principally, a rise of the temperature leads to shorter etching times.

The $CdCl_2$ generated in the etching process and the $TeCl_4$ are suitably recovered on cold surfaces as precipitates. For this purpose, the hot gas is conducted to cooling or cold traps, which lie outside the proper treatment chamber. Possible embodiments of the cold traps are very simple, particularly, because both chlorides exhibit extremely low vapour pressures due to condensation at 150 to 200° C. In an advantageous embodiment water-cooled traps are used.

The $CdCl_2$ generated in the etching process and the $TeCl_4$ can also be made to condense separately. For this purpose, the hot gases drawn by means of a pumping manifold into the cold traps are cooled first to a temperature of around 350° C., at which only the $CdCl_2$ precipitates, and then are further cooled to a temperature of around 150° C. or less, at which the $TeCl_4$ precipitates. Instead of 350° C. one could also use e.g. 300° C. and instead of 150° C., e.g. also 200° C. However, this would disadvantageously reduce the distance between the two temperature values.

The TCO layer (preferably ITO) not etched away can remain on the glass or be removed by means of HCl gas, whereby corresponding chlorides and water ($InCl_3$, $SnCl_{2,4}$ and $H_2O$) are generated.

The etching step according to the present invention in a chlorine and preferably also nitrogenous gas atmosphere can also be used without the preceding pyrolysis for treating glass substrates not yet subdivided but already coated with CdTe/CdS (which are not yet provided with the back glass), in order to remove the CdTe/CdS layers. In this way, it is possible to advantageously cope with production discard in form of unsatisfactory coated glass substrates without using a wet-chemical treatment. Likewise, if the CdTe and CdS layers are to be removed in a different way (e.g. by a wet-chemical process already installed or treatment with sandblasts), the pyrolytic decomposition of the plastics adhesive can be applied before.

In the following, an embodiment of the inventional process is explained in more detail.

Solar cell modules of the type disclosed herein are crushed with a striking tool, e.g. a hammer mill, into fragments of a size of some cm and are charged into a quartz chamber. The chamber has pumping devices (2033 CP+ and CFF Turbo of Alcatel) and several pressure meters (Thermovac TM20S and Penningvac PM310 of Leybold Heraeus) and gas handling manifolds. Such chambers are used for example for the activation of solar cell modules. The metal contacts of the modules need not be removed in order to be able to successfully use the process according to the invention.

Once the modules are mechanically disintegrated into module fragments, air is pumped through the chamber with a flow rate of approximately 1 liter/min and under atmospheric pressure. Heating can be accomplished by any type of heating means. In the present embodiment, a self designed tubular furnace with resistance heating was used. The temperature is adjusted at about 400° C. The combustion gases which are generated are pumped off. After about 10 to 15 minutes the ethylen/vinylacetate-Copolymer (EVA) has substantially decomposed into $CO_2$ and $H_2O$.

Afterwards, the chamber is evacuated and a premixed nitrogen/chlorine gas mixture with a partial pressure of 200 mbar nitrogen and 5 mbar chlorine gas is supplied into the chamber to free the module fragments from the adhesive in an etching step. Through a pumping manifold provided for this purpose, the $CdCl_2$ and $TeCl_4$ gases being generated in the etching process are pumped into another chamber provided with cold traps and precipitate on the cooling surfaces thereof. Of course, the module fragments can be subjected to the etching step using a separate chamber without departing from the scope of the present invention. For this purpose, another chamber being equipped with halogen radiators for heating was used in a further experiment.

Alternatively, the $CdCl_2$ and the $TeCl_4$-gases are cooled first to a temperature of about 350° C., at which only $CdCl_2$ precipitates, in a first cold trap and afterwards, they are cooled to a temperature of about 150° C. or less, at which $TeCl_4$ precipitates in a second downstream cold trap.

The remaining glass fragments with and without TCO layer then can, for example, be given to glass processing companies. Of particular advantage is to etch away the TCO-layer with HCl gas in a further step that follows etching the glass fragments to remove the CdTe/CdS. If the TCO layer consists of tin oxide, only tin chloride is generated, if it consists of ITO, indium chloride is additionally generated in the further step. In this way, is it possible to recover the precious indium by further processing the corresponding indium containing precipitation product. The tin chloride can also be collected by means of a cold trap as precipitation. Moreover, glass processing companies prefer those glass fragments that are now free from all layers.

Preferably, the reactive HCl gas is again diluted with nitrogen and a HCl/N$_2$— mixture is used in which the minimal partial pressure ratio between HCl and nitrogen is preferably adjusted to values of about 1:100. The temperature preferred is again higher than 400° C. and in case of glass substrates in form of soda-lime glass lower than about 520° C.

Suitable devices for carrying out the process according to the invention are devices for handling bulk material, for example, rotating drums which effect a whirling motion of the fragments therein during the reaction treatment.

The modules treated with the process according to the present embodiment had a nickel-containing back contact layer. Also other back contact materials like molybdenum or material components such as vanadium and the like are already etched away in the etching step. If desired, they can also be made to selectively precipitate by means of further cold traps being adjusted to different temperatures.

While there has been shown and described what are at present considered the preferred embodiments of the invention, it will be obvious to those skilled in the art that various changes and modifications can be made therein without departing from the scope of the invention defined by the appended claims.

What is claimed is:

1. A method for recycling CdTe/CdS thin film solar cell modules, said method comprising:
   a) mechanically disintegrating thin film solar cell modules into module fragments;
   b) exposing said module fragments to an oxygen-containing atmosphere at a temperature of at least 300° C. causing a pyrolysis of adhesive material contained in the module fragments in the form of a hydrocarbon based plastics adhesive material and the gaseous decomposition products that generate during the pyrolysis are discharged; and
   c) exposing said module fragments freed from the adhesive means to a chlorine-containing gas atmosphere at a temperature of more than 400° C. causing an etching process wherein the CdCl$_2$ and TeCl$_4$ that are generated in the etching process are made to condense and precipitate by cooling.

2. The method according to claim 1, characterized in that in step c) a chlorine and nitrogen containing gas atmosphere is used.

3. The method according to claim 1, characterized in that the plastics adhesive material on hydrocarbon base comprise ethylen/vinyl-acetate-Copolymers (EVA).

4. The method according to claim 1, characterized in that in an additional step d) following step c), a TCO layer of the module fragments remaining on the glass is etched away by means of HCl gas, which is preferably diluted with nitrogen.

5. The method according to claim 4, characterized in that the HCl gas is diluted with nitrogen.

6. The method according to claim 1, characterized in that the pyrolysis step b) is performed at temperatures of more than 400° C.

7. The method according to claim 4, characterized in that the etching step d) is performed at temperatures of more than 400° C.

8. The method according to claim 1, characterized in that the gas atmosphere in step c) is adjusted to a reduced pressure.

9. The method according to claim 4, characterized in that the gas atmosphere in step d) is adjusted to a reduced pressure.

10. The method according to claim 2, characterized in that the chlorine and nitrogenous gas-atmosphere contains chlorine and nitrogen in a partial pressure ratio of chlorine to nitrogen between 0.01 and 0.1.

11. The method according claim 1, characterized in that the pyrolysis of step b) is performed in 1 to 15 minutes.

12. The method according to claim 1, characterized in that the etching process in step c) in a gas-atmosphere containing chlorine and optionally nitrogen is performed at temperatures of about 450° C. or higher temperatures.

13. The method according to claim 4, characterized in that the etching process in d) in the gas-atmosphere containing chlorine and optionally nitrogen is performed at temperatures of about 450° C. or higher temperatures.

14. The method according to claim 1, characterized in that CdCl$_2$ and TeCl$_4$ which are generated in the etching process are collected on cold surfaces as precipitates.

15. The method according to claim 1, characterized in that CdCl$_2$ and TeCl$_4$ which are generated in the etching process are led to cold traps.

16. The method according claim 1, characterized in that CdCl$_2$ and TeCl$_4$ which are generated in the etching process are cooled first to a temperature at which only CdCl$_2$ forms a precipitate, and afterwards, are further cooled to a temperature at which TeCl$_4$ precipitates.

* * * * *

UNITED STATES PATENT AND TRADEMARK OFFICE
CERTIFICATE OF CORRECTION

PATENT NO. : 6,572,782 B2
DATED : June 3, 2003
INVENTOR(S) : Campo et al.

It is certified that error appears in the above-identified patent and that said Letters Patent is hereby corrected as shown below:

Column 1,
Line 36, "ENA" should be -- E/VA --

Column 6,
Lines 31 and 35, "optionally" should be deleted

Signed and Sealed this

Twenty-sixth Day of October, 2004

JON W. DUDAS
*Director of the United States Patent and Trademark Office*